United States Patent [19]

Tsuji

[11] Patent Number: 5,090,919

[45] Date of Patent: Feb. 25, 1992

[54] TERMINAL PIECE SEALING STRUCTURE

[75] Inventor: Hideaki Tsuji, Yamaga, Japan

[73] Assignee: Omron Corporation, Kyoto, Japan

[21] Appl. No.: 556,719

[22] Filed: Jul. 26, 1990

Related U.S. Application Data

[63] Continuation of Ser. No. 470,636, Jan. 26, 1990, abandoned.

[30] Foreign Application Priority Data

Jan. 26, 1989 [JP] Japan ............................... 1-8097[U]

[51] Int. Cl.$^5$ ............................................. H01R 13/52
[52] U.S. Cl. ................... 439/519; 439/936; 174/52.2
[58] Field of Search ............... 439/82, 84, 201, 204, 439/271, 276, 426, 519, 591, 751, 873, 936; 174/52.2, 76; 361/404

[56] References Cited

U.S. PATENT DOCUMENTS

| | | | |
|---|---|---|---|
| 3,731,254 | 5/1973 | Key | 439/936 X |
| 4,011,398 | 3/1987 | Munz et al. | 174/52 PE |
| 4,012,579 | 3/1977 | Fox et al. | 174/52.2 |
| 4,183,610 | 1/1980 | Key | 439/873 X |
| 4,645,278 | 2/1987 | Yevak, Jr. et al. | 439/936 X |
| 4,729,739 | 3/1988 | Coffee et al. | 439/936 X |
| 4,788,626 | 11/1988 | Neidig et al. | 174/52.2 X |

Primary Examiner—Neil Abrams
Assistant Examiner—Khiem Nguyen
Attorney, Agent, or Firm—Foley & Lardner

[57] ABSTRACT

A seal structure for an electric device having an electrically conductive lead portion which passes through a through hole in a bottom surface of an electrically insulating housing. Additionally, the housing is provided with a lateral slot in a side surface thereof which is in communication with the through hole and which is filled with a sealant. Thus, the sealant which has been filled into the lateral slot adheres to the surface of the terminal piece exposed in the interior of the lateral slot and is solidified therein. Therefore, when this electric device is mounted on a printed circuit board, and its lead portions are soldered to a printed pattern of the printed circuit board, flux is prevented from reaching the internal part of the lead portion, and various problems which are otherwise caused by intrusion of flux into the interior of the housing can be effectively prevented.

10 Claims, 4 Drawing Sheets

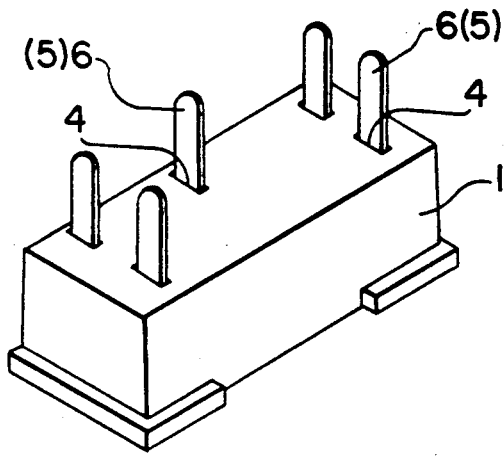
FIG. 3
PRIOR ART
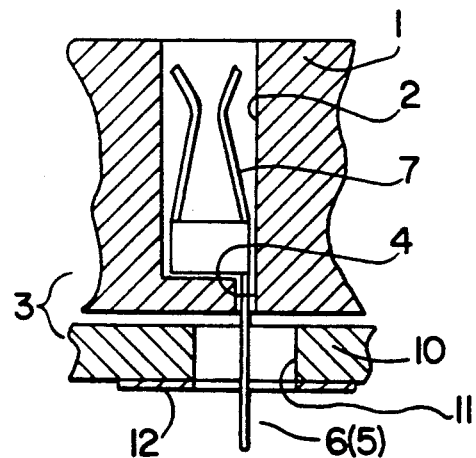
FIG. 5
PRIOR ART
FIG. 4
PRIOR ART

TERMINAL PIECE SEALING STRUCTURE

This is a Continuation of application Ser. No. 07/470,636, filed Jan. 1990 now abandoned.

TECHNICAL FIELD

The present invention relates to a sealing structure for terminal pieces projecting from an electric device, and in particular to a sealing structure for terminal pieces of electric devices which are adapted to be mounted on a printed circuit board.

BACKGROUND OF THE INVENTION

FIGS. 3 through 5 illustrate a socket comprising a box-shaped housing 1, and a plurality of terminal pieces 5. Each of the terminal pieces 5 comprises a socket portion 7 made of elastic and electroconductive material and adapted to receive a lead pin of an electronic component such as IC's and small relays not shown in the drawings, and a lead portion 6 extending integrally therefrom. Each of the socket portions 7 is securely received in an associated one of a plurality of cavities 2 provided in the housing 1, and the lead portions 6 are each passed through an associated one of a plurality of through holes 4 extending across the bottom wall of the housing 1 and project from the bottom surface of the housing 1. In this case, the lead portions 6 consist of a generally planar tongue piece. When this socket is mounted on a circuit board 10, each of the lead portions 6 is passed through a mounting hole 11 of the printed circuit board 10, and is soldered to an electroconductive pattern 12 formed on the external surface of the printed circuit board 10.

However, according to this socket, flux which is used for soldering its lead portions 6 tends to get into the gaps between the through holes 4 and the lead portions 6 through the gaps between the mounting holes 11 and the lead portions 6 thereby causing flux to be deposited on the surface of the socket portion 7 of each of the terminal pieces 5, and bad contact could occur.

In particular, when a large current capacity is involved, the width of each lead portion 6 becomes accordingly large, and the chance of flux intrusion and resulting bad contact increases due to the increase in the diameter of each of the mounting holes 11 of the printed circuit board 10 and the gaps between the through holes 11 and the lead portions 6.

To eliminate this problem, it may be possible to bend each lead portion 6 into a C-shaped cross section to thereby reduce the diameter of the through holes 4 and the mounting holes 11 as illustrated in FIG. 6 through 8 in which like parts are denoted with like numerals. In this way, it is possible to reduce the gaps between the mounting holes 11 of the printed circuit board 10 and the lead portions 6. However, flux can still pass through the groove 6a of each of the terminal pieces 6, and get into the socket portion 7.

FIGS. 9 and 9 illustrates a structure which utilizes a sealant 8 to close the gap between the lead portion 6 of each of the terminal pieces 5 and the associated through hole 4 of the housing 1. The bottom surface of the housing 1 is provided with a depression 1a, and the sealant 8 is filled into this depression 1a. The sealant 8 can thus effectively close the gaps between the lead portions 6 and the through holes 4.

However, according to this structure, the sealant 8 tends to cling to the surface of each of the lead portions 6 and travel along it when filling the sealant 8 into the depression 1a, and this not only could cause bad contact at the socket portions 7 but also could prevent close contact between the housing 1 and the printed circuit board 10 because a part of the sealant 8 which has solidified around the base end of each of the lead portions 6 could abut the surface of the printed circuit board 10, thereby causing fluctuations in the mounting height of the housing 1 relative to the printed circuit board 10.

BRIEF SUMMARY OF THE INVENTION

In view of such problems of the prior art, a primary object of the present invention is to provide a terminal piece sealing structure for an electric device which can prevent intrusion of flux into the housing of the electric device.

A second object of the present invention is to provide a terminal piece sealing structure which can control fluctuation in the mounting height of the socket electric device when it is mounted on a printed circuit board.

According to the present invention, these and other objects can be accomplished by providing a seal structure for an electric device having an electrically conductive lead portion passed through a through hole in a bottom surface of an electrically insulating housing. Additionally, the housing is provided with a lateral slot in a side surface thereof which is in communication with the through hole and which is filled with a sealant.

Thus, the sealant which has been filled into the lateral slot adheres to the surface of the terminal piece exposed in the interior of the lateral slot and is solidified therein. Therefore, when this electric device is mounted on a printed circuit board, and its lead portions are soldered to a printed pattern of the printed circuit board, flux is prevented from reaching the internal part of the lead portion, and various problems which are otherwise caused by intrusion of flux into the interior of the housing can be effectively prevented.

To minimize the necessary amount of the sealant, and to ensure the mechanical strength of the bottom of the housing, it is preferred that a plurality of lead portions are passed through a plurality of through holes in the bottom surface, and that the lateral slot comprises a plurality of narrow and branched slots each leading to one of the through holes.

According to a preferred embodiment of the present invention, the lead portion has a C-shaped cross section, and the through hole is substantially conformal to the cross section of the lead portion. In this way, the gaps between the lead portion and the through hole is minimized, and the possibility of flux getting into the housing of the electric device is even more positively prevented.

BRIEF DESCRIPTION OF THE DRAWINGS

Now the present invention is described in the following in terms of a specific embodiment with reference to the appended drawings, in which:

FIG. 3 is a perspective view of a socket terminal given as a first example of the related art;

FIG. 4 is a fragmentary sectional view of same;

FIG. 5 is a perspective view of same;

DETAILED DESCRIPTION OF THE PREFERRED EMBODIMENT(S)

Figure 1:
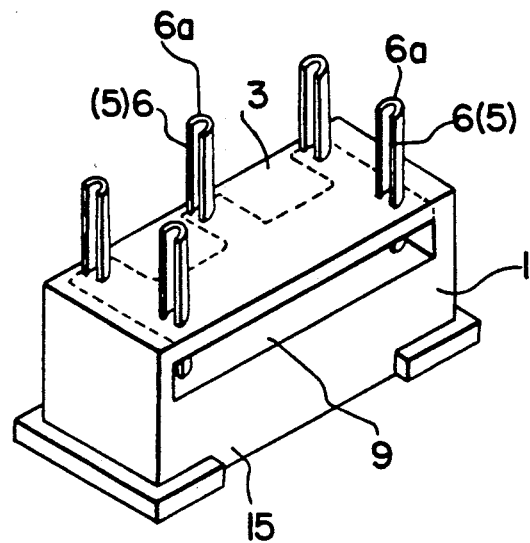
FIGS. 1 and 2 are a perspective view and a fragmentary sectional view of an embodiment of the electric device according to the present invention.
Figure 2:
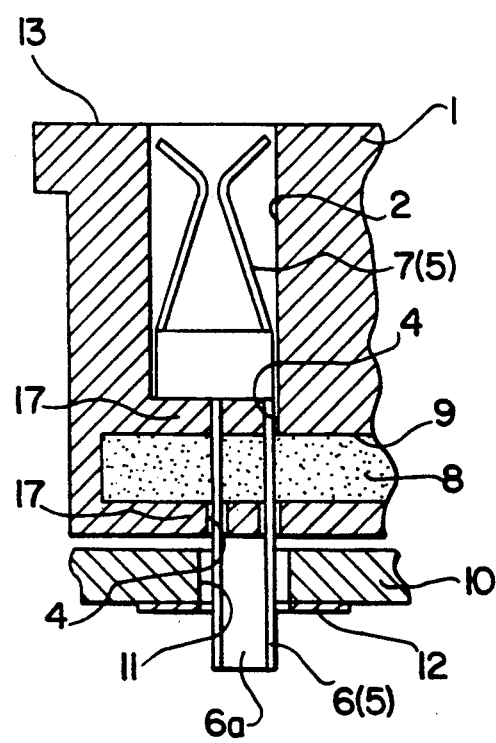
Figure 6:
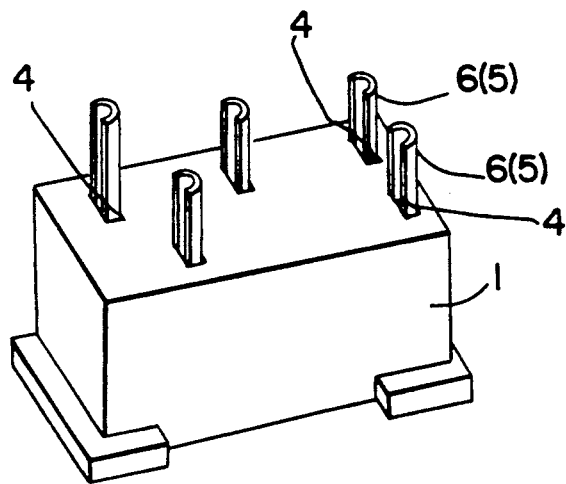
FIG. 6 is a perspective view of a second example of the related art.
Figure 8:
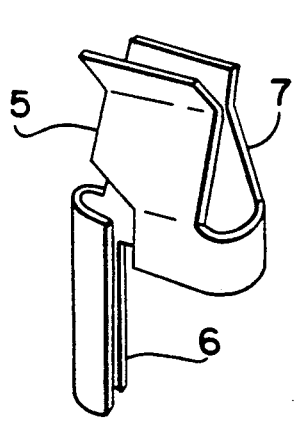
FIG. 8 is a perspective view of same.
Figure 7:
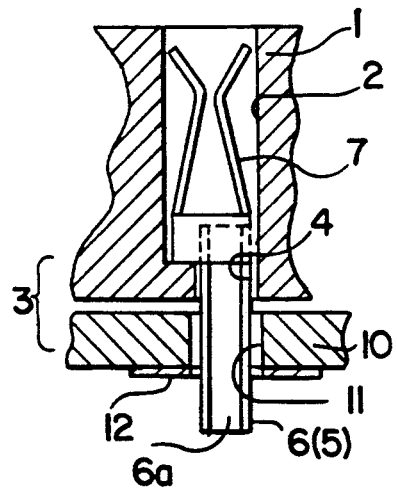
FIG. 7 is a fragmentary sectional view of same.
Figure 9:
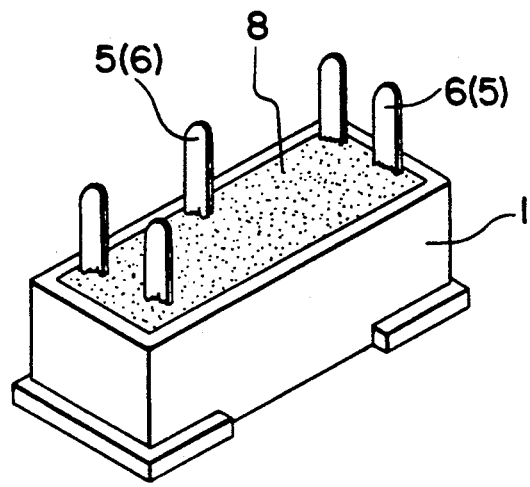
FIGS. 9 and 10 are a perspective view and a fragmentary sectional view of a third example of the related art.
Figure 10:
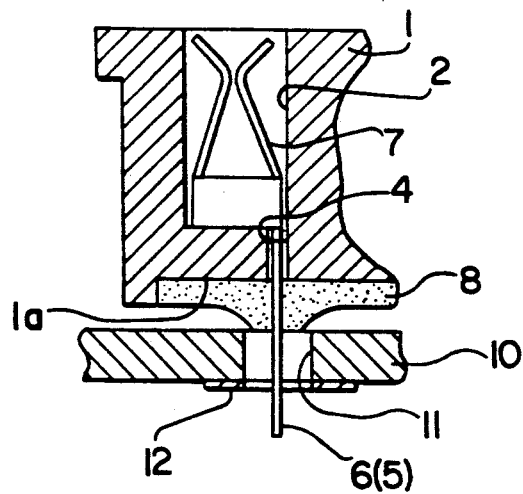

According to the present embodiment which is applied to a socket adapted to be mounted on a printed circuit board as was the case with the aforementioned related art examples, the housing 1 of the socket has a top surface 13, a bottom surface 3, a side surface 15 and a bottom wall 17. In addition, a plurality of cavities 2, extend from the top surface 13 into a housing 1 where they are in communication with a respective one of a plurality of through holes 4. The through holes 4 extend from the bottom surface 3 and through bottom wall 17 to the cavities 2. Housing 1 also has a lateral seal slot 9 disposed in the side surface 15 which extends into the bottom wall 17 so that the seal slot 9 is in communication with the through holes 4.

Lead portions 6 of the terminal pieces 5 each having a U-shaped cross section and passed through an associated through hole 4 such that the socket portions 7 of the terminal pieces 5 are engaged and secured in the cavities 2 subsequent to engagement of socket portions 7 in the cavities 2, a sealant 8 is filled into the seal slot 9 and is cured therein to product a sealing effect as a last assembly step.

The seal slot 9 is formed in the shape of a comb as indicated by the dotted line in FIG. 1, which produces a savings in the amount of sealant 8 required as compared to a slot of uniform depth. However, this comb shape is not essential and the seal slot may have a uniform depth. Also, by reducing the volume of the seal slot 9, the mechanical strength of the bottom surface of the housing is increased.

When the socket 1 of the present invention is to be mounted on the printed circuit board 10, the lead portions 6 are passed through the mounting holes 11 of the printed circuit board 10, and the protruding free ends of the lead portions 6 are electrically connected with a copper foil pattern 12 of the printed circuit board 10, by soldering, which completes the mounting process.

According to the present embodiment, the through holes 4 are substantially U-shaped and only small gaps are left between the lead portions 6 and the through holes 4. Thus once the U-shaped lead portions 6 are fitted into the through holes 4, intrusion of flux from the grooves 6a of the lead portions 6 is prevented, and bad contact can be effectively avoided.

Although the above described embodiment was directed to a socket, the present invention can be applied to other electric devices such as, for example, of relays and switches, and the bases may not necessarily be box-shaped but may also be planar.

The lead portions are also not limited to those having a U-shaped cross sections, but may also be planar or rod-shaped as long as the through holes are adapted to the cross sections of the particular lead portions.

As can be understood from the above description, according to the present invention, since the sealant solidifies within the seal slot provided in the bottom wall in close contact with the surface of the lead portions exposed therein, the gaps between the lead portions and the through holes are closed and intrusion of flux can be effectively prevented.

Furthermore, since the sealant is filled into a slide opening seal slot, and the sealant is filled into the seal slot from a direction which is perpendicular to the lengthwise direction of the lead portions, the sealant is prevented from travelling along the surface of the lead portions, and bad contact can be prevented.

Further, since the sealant is solidified in the seal slot, the sealant will not cling and rise along the lead portions, and the fluctuation of the mounting height of the socket can be effectively prevented.

What we claim is:

1. A seal structure for an electric device, comprising:
   an electrically insulating housing having a through hole in a bottom surface thereof and a lateral slot in a side surface thereof, said slot being in communication with said through hole;
   an electrically conductive lead portion partially disposed in said through hole and passing completely through said slot;
   a sealant disposed in said lateral slot, wherein said sealant is injected directly into said slot to prevent flux from travelling along said lead portion and said sealant from clinging and rising along said lead portion.

2. A seal structure for an electric device according to claim 1, further comprising a plurality of lead portions, wherein said bottom surface comprises a plurality of said through holes, each of said lead portions being partially disposed in a respective one of said through holes, and said lateral slot comprises a plurality of narrow and branched slots, each of said narrow and branched slots being in communication with a respective one of said through holes.

3. A seal structure for an electric device according to claim 1, wherein said lead portion has a substantially C-shaped cross-section and said through hole substantially conforms to said C-shaped cross-section of said lead portion.

4. A seal structure for an electric device according to claim 1, wherein said housing has a cavity in a top surface thereof which is in communication with said through hole.

5. A seal structure for an electric device according to claim 1, wherein said lead portion has a planar cross-section and said through hole substantially conforms to said planar cross-section.

6. A seal structure for an electric device according to claim 1, wherein said lead portion has a circular cross-section and said through hole substantially conforms to said circular cross-section.

7. A seal structure for an electric device, comprising:
   an electrically insulating housing having a through hole which extends through a bottom wall thereof, and a lateral slot extending from a side surface of said housing into said bottom wall, said lateral slot being in communication with said through hole;
   an electrically conductive lead portion which passes through said through hole and said lateral slot; and
   a sealant disposed in said lateral slot, said sealant surrounding a section of said lead portion which is disposed in said lateral slot.

8. A method for sealing an electric device having a terminal including an electrically conductive lead portion in an electrically insulating housing having a bottom surface with a through hole therein and a side surface having a lateral slot therein, comprising the steps of:
   a) forming said through hole in said electrically insulating housing, said through hole extending from said bottom surface of said housing;

b) forming said lateral slot in said side surface of said housing such that said slot and said through hole are in communication;

c) inserting said electrically conductive lead portion into said through hole and through said slot;

d) injecting sealant directly into said slot; and e) curing said sealant.

9. A method for sealing according to claim 8, wherein step a) comprises forming a plurality of through holes in said housing;

step b) comprises forming said lateral slot with a plurality of narrow branched slots, each of said narrow branched slots being in communication with one of said through holes; and step c) comprises inserting a plurality of electrically conductive lead portions into said housing, each of said lead portions being inserted into a respective one of said through holes and passing through a respective one of said narrow branched slots.

10. A method for sealing according to claim 9, wherein step a) comprises forming said through holes with a substantially c-shaped cross-section; and said electrically conductive lead portions have a substantially c-shaped cross-section.

* * * * *